US012424409B2

(12) United States Patent
Yoshino et al.

(10) Patent No.: US 12,424,409 B2
(45) Date of Patent: *Sep. 23, 2025

(54) SUBSTRATE PROCESSING APPARATUS, SUBSTRATE PROCESSING METHOD, METHOD OF MANUFACTURING SEMICONDUCTOR DEVICE, AND NON-TRANSITORY COMPUTER-READABLE RECORDING MEDIUM

(71) Applicant: Kokusai Electric Corporation, Tokyo (JP)

(72) Inventors: Teruo Yoshino, Toyama (JP); Naofumi Ohashi, Toyama (JP); Tadashi Takasaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/425,033

(22) Filed: Jan. 29, 2024

(65) Prior Publication Data
US 2024/0170253 A1 May 23, 2024

Related U.S. Application Data

(63) Continuation of application No. 17/994,763, filed on Nov. 28, 2022, now Pat. No. 11,923,173, which is a
(Continued)

(30) Foreign Application Priority Data
Oct. 29, 2021 (JP) .................................. 2021-178348

(51) Int. Cl.
*H01J 37/32* (2006.01)

(52) U.S. Cl.
CPC ...... *H01J 37/321* (2013.01); *H01J 37/32128* (2013.01); *H01J 37/32183* (2013.01)

(58) Field of Classification Search
None
See application file for complete search history.

(56) References Cited

U.S. PATENT DOCUMENTS 5,888,414 A * 3/1999 Collins ............ H01J 37/32165
257/E21.252
5,990,017 A * 11/1999 Collins ................ H01J 37/321
257/E21.252
(Continued)

FOREIGN PATENT DOCUMENTS

JP 10-284291 A 10/1998
JP 2000-012296 A 1/2000
(Continued)

OTHER PUBLICATIONS

Notice of Reasons for Refusal with English translation in Japanese Application No. 2021-178348, dated Sep. 27, 2023, 13 pages.

*Primary Examiner* — Srinivas Sathiraju
(74) *Attorney, Agent, or Firm* — Edell, Shapiro & Finnan, LLC

(57) ABSTRACT

There is provided a technique capable of improving a uniformity of a substrate processing on a substrate surface. According to one aspect thereof, there is provided a substrate processing apparatus including: a substrate processing room; a plasma generation room; a gas supplier supplying a gas into the plasma generation room; a first coil surrounding the plasma generation room and to which an electric power is supplied; and a second coil surrounding the plasma generation room and to which an electric power is supplied. An axial direction of the second coil is equal to that of the first coil, a winding diameter of the second coil is different from that of the first coil, and a peak of a voltage distribution
(Continued)

generated by supplying the electric power to the second coil does not overlap with a peak of a voltage distribution generated by the first coil.

20 Claims, 8 Drawing Sheets

Related U.S. Application Data continuation of application No. 17/692,722, filed on Mar. 11, 2022, now Pat. No. 11,538,661.

(56) References Cited

U.S. PATENT DOCUMENTS

| | | | | |
|---|---|---|---|---|
| 6,068,784 A * | 5/2000 | Collins | | H01J 37/321 257/E21.252 |
| 6,083,344 A * | 7/2000 | Hanawa | | H01J 37/32174 156/345.48 |
| 6,254,738 B1 * | 7/2001 | Stimson | | H01F 29/10 204/192.12 |
| 6,488,807 B1 * | 12/2002 | Collins | | H01J 37/32522 257/E21.252 |
| 6,685,798 B1 * | 2/2004 | Holland | | H01J 37/321 118/723 AN |
| 7,572,647 B2 * | 8/2009 | Chen | | H01L 21/02164 257/E21.478 |
| 7,789,993 B2 * | 9/2010 | Chen | | H01J 37/321 118/723 AN |
| 7,811,941 B1 * | 10/2010 | Becker | | H01L 21/3065 438/719 |
| 8,398,832 B2 * | 3/2013 | Nulman | | H01J 37/34 204/298.11 |
| 9,155,911 B1 * | 10/2015 | Balakin | | A61N 5/1081 |
| 10,249,470 B2 * | 4/2019 | Kenney | | H01J 37/04 |
| 10,288,649 B2 * | 5/2019 | Seki | | G01R 19/0092 |
| 10,934,622 B2 * | 3/2021 | Yoshino | | C23C 16/4586 |
| 11,495,435 B2 * | 11/2022 | Yoshino | | H01J 37/32174 |
| 11,569,070 B2 * | 1/2023 | Sekiya | | H01L 21/3065 |
| 2002/0004309 A1 * | 1/2002 | Collins | | H01J 37/32146 438/719 |
| 2002/0078893 A1 * | 6/2002 | Os | | H01J 37/321 156/345.48 |
| 2003/0042131 A1 * | 3/2003 | Johnson | | H01J 37/321 204/192.12 |
| 2004/0223579 A1 * | 11/2004 | Lee | | H05H 1/46 376/123 |
| 2005/0067157 A1 * | 3/2005 | Faybishenko | | H01J 37/321 165/185 |
| 2005/0109462 A1 * | 5/2005 | Lee | | H01J 37/321 156/345.48 |
| 2006/0057854 A1 * | 3/2006 | Setsuhara | | H01J 37/321 438/710 |
| 2008/0185284 A1 * | 8/2008 | Chen | | H01J 37/321 118/723 R |
| 2008/0188087 A1 * | 8/2008 | Chen | | H01L 21/31604 438/758 |
| 2008/0188090 A1 * | 8/2008 | Chen | | C23C 16/507 257/E21.24 |
| 2013/0278142 A1 * | 10/2013 | Dorf | | H01J 37/32183 315/111.41 |
| 2014/0020837 A1 * | 1/2014 | Nguyen | | H05H 1/46 156/345.48 |
| 2015/0075716 A1 * | 3/2015 | Ramaswamy | | H01J 37/32458 315/111.21 |
| 2015/0108898 A1 * | 4/2015 | Cheung | | H05H 1/30 315/111.51 |
| 2015/0265854 A1 * | 9/2015 | Balakin | | A61N 5/107 600/1 |
| 2017/0004966 A1 * | 1/2017 | Sato | | H01J 37/32183 |
| 2017/0115328 A1 * | 4/2017 | Seki | | G01R 19/0092 |
| 2017/0278686 A1 * | 9/2017 | Brcka | | C23C 14/345 |
| 2018/0211811 A1 * | 7/2018 | Kenney | | H05H 1/46 |
| 2020/0126766 A1 * | 4/2020 | Sekiya | | H01J 37/3255 |
| 2020/0219698 A1 * | 7/2020 | Ye | | H01L 21/67167 |
| 2020/0365367 A1 * | 11/2020 | Yoshino | | H01J 37/32577 |
| 2021/0020405 A1 * | 1/2021 | Ventzek | | C23C 16/45544 |
| 2022/0051878 A1 * | 2/2022 | Sekiya | | H01J 37/18 |
| 2023/0139945 A1 * | 5/2023 | Yoshino | | H01J 37/321 315/111.21 |

FOREIGN PATENT DOCUMENTS

| | | | | |
|---|---|---|---|---|
| JP | 2017-83220 A | | 5/2017 | |
| JP | 2020161541 A | * | 10/2020 | H01J 37/32082 |
| JP | 2020-188229 A | | 11/2020 | |
| WO | WO-2020161541 A1 | * | 8/2020 | B23K 20/125 |

* cited by examiner

SUBSTRATE PROCESSING APPARATUS, SUBSTRATE PROCESSING METHOD, METHOD OF MANUFACTURING SEMICONDUCTOR DEVICE, AND NON-TRANSITORY COMPUTER-READABLE RECORDING MEDIUM

CROSS REFERENCE TO RELATED APPLICATIONS

This non-provisional U.S. patent application is a continuation of U.S. patent application Ser. No. 17/994,763 filed on Nov. 28, 2022, which is a continuation of U.S. patent application Ser. No. 17/692,722 filed on Mar. 11, 2022 and claims priority under 35 U.S.C. § 119 of Japanese Patent Application No. 2021-178348, filed on Oct. 29, 2021, in the Japanese Patent Office, the entire contents of which are hereby incorporated by reference.

TECHNICAL FIELD

The present disclosure relates to a substrate processing apparatus.

BACKGROUND

According to some related arts, a substrate processing apparatus capable of performing a substrate processing by exciting a process gas into a plasma state by supplying an electric power to two coils may be used.

For example, in the substrate processing apparatus described above, the two coils of the same diameter are arranged coaxially. Therefore, a plasma density may be biased in a direction parallel to a surface of the substrate, and a uniformity of the substrate processing on the surface of the substrate may decrease.

SUMMARY

According to the present disclosure, there is provided a technique capable of improving a uniformity of a substrate processing on a surface of a substrate.

According to one aspect of the technique of the present disclosure, there is provided a substrate processing apparatus including: a plasma generation space capable of generating a plasma; a substrate processing space capable of processing a substrate; a gas supplier capable of supplying a gas into the plasma generation space; a first coil provided to surround the plasma generation space and configured to generate a first voltage distribution; and a second coil provided to surround the plasma generation space and configured to generate a second voltage distribution such that a peak of the second voltage distribution does not overlap with a peak of the first voltage distribution.

DETAILED DESCRIPTION

Embodiments

Figure 1:
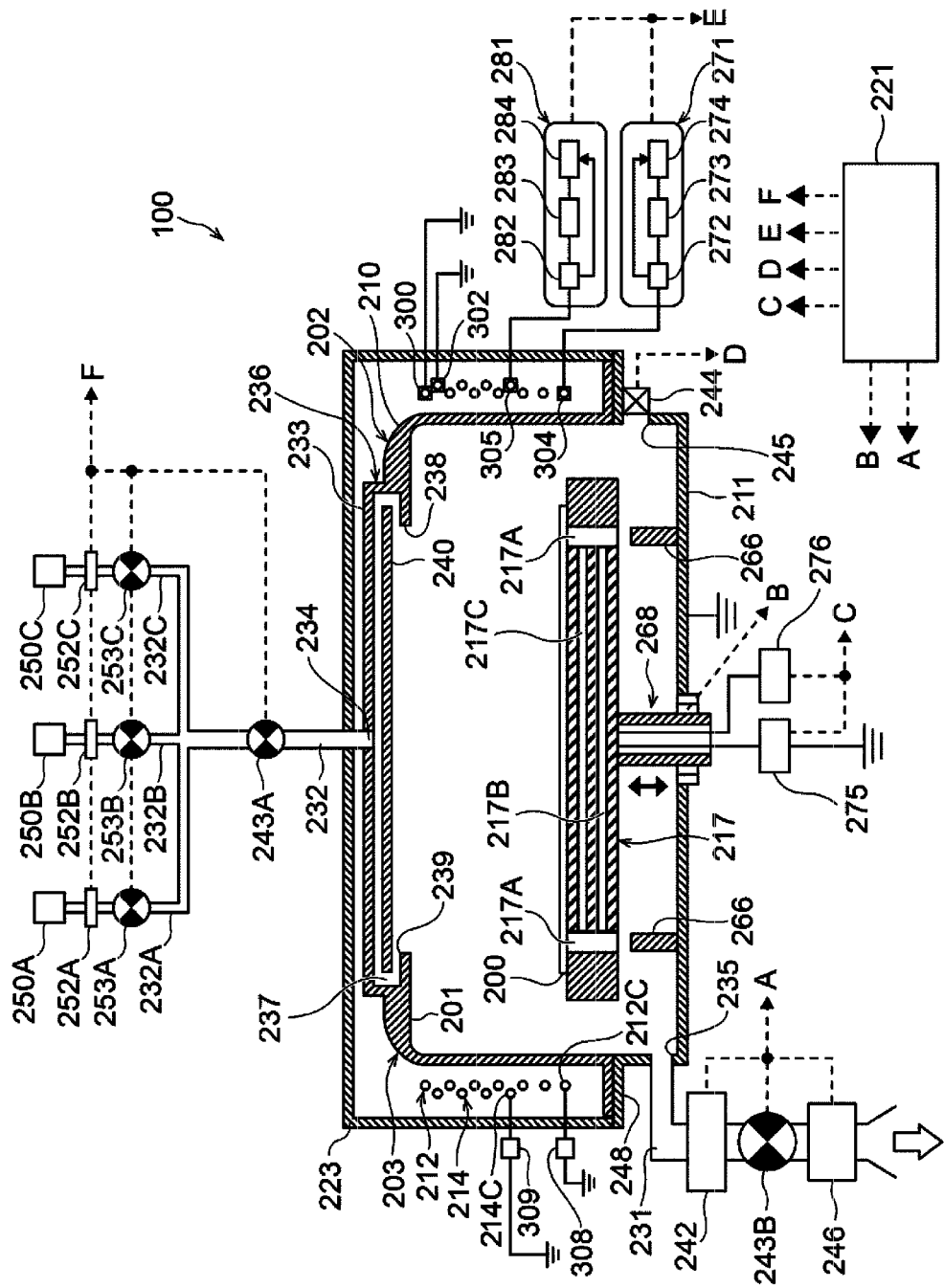
FIG. 1 is a diagram schematically illustrating a configuration of a substrate processing apparatus preferably used in one or more embodiments of the present disclosure.
Figure 2:
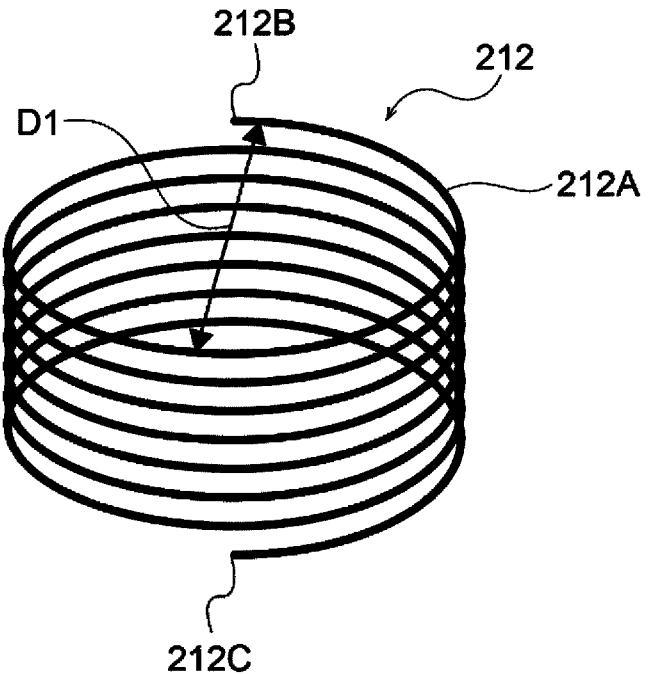
FIG. 2 is a diagram schematically illustrating a first resonance coil used in a comparative example of the present disclosure.
Figure 3:
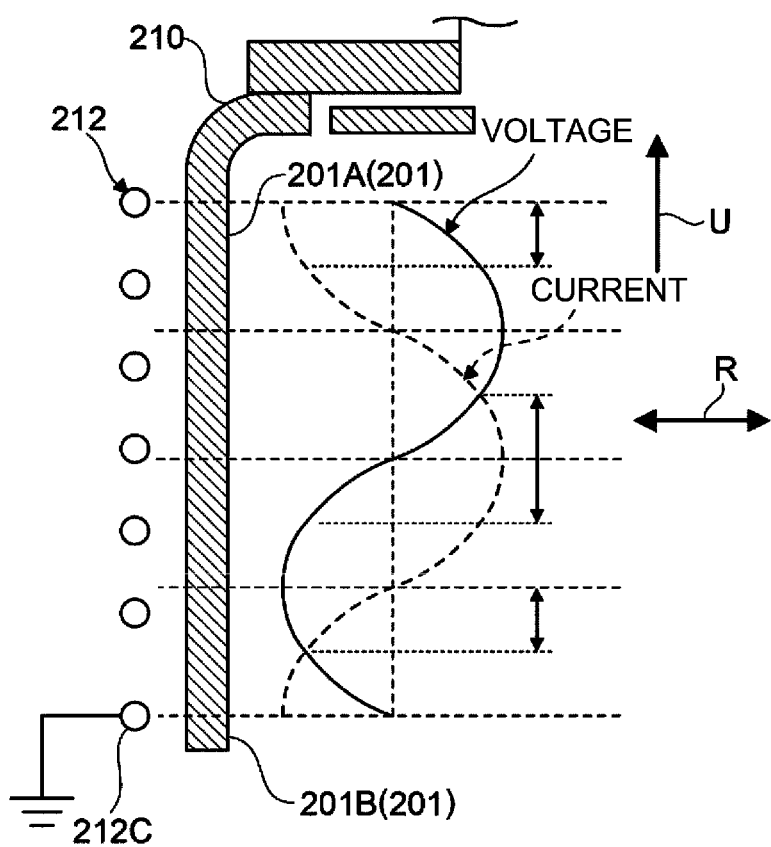
FIG. 3 is a diagram schematically illustrating a relationship between a current and a voltage in the first resonance coil shown in FIG. 2.

Hereinafter, one or more embodiments (also simply referred to as "embodiments") according to the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

Hereinafter, a substrate processing apparatus 100 according to the embodiments of the present disclosure will be described with reference to FIGS. 1 through 10. For example, the substrate processing apparatus 100 according to the present embodiments is configured to mainly perform a substrate processing such as an oxidation process onto a film formed on a surface of a substrate or onto a base of the substrate.

<Process Chamber>

The substrate processing apparatus 100 includes a process furnace 202 in which a wafer 200 serving as the substrate is processed by a plasma. The process furnace 202 includes a process vessel 203, and a process chamber 201 is defined by the process vessel 203. The process vessel 203 includes a dome-shaped upper vessel 210 serving as a first vessel and a bowl-shaped lower vessel 211 serving as a second vessel. By covering the lower vessel 211 with the upper vessel 210, the process chamber 201 is defined. The upper vessel 210 constitutes a plasma vessel in which a plasma generation space 201A is provided. In the plasma generation space 201A, a process gas is excited into a plasma state.

In addition, a gate valve 244 is provided on a lower side wall of the lower vessel 211. While the gate valve 244 is open, the wafer 200 can be transferred (loaded) into the process chamber 201 through a substrate loading/unloading port 245 using a substrate transfer device (not shown) or be transferred (unloaded) out of the process chamber 201 through the substrate loading/unloading port 245 using the substrate transfer device. While the gate valve 244 is closed, the gate valve 244 maintains the process chamber 201 airtight.

The process chamber 201 includes the plasma generation space 201A and a substrate processing space 201B. The plasma generation space 201A is a space in which a first resonance coil 212 and a second resonance coil 214, which are coils serving as electrodes, are provided around the space, and the plasma is generated in the plasma generation space 201A. More specifically, the plasma generation space 201A refers to a space in the process chamber 201 above a lower end of the first resonance coil 212 and below an upper end of the first resonance coil 212. The substrate processing space 201B is a space that communicates with the plasma generation space 201A and in which the wafer 200 is processed. More specifically, the substrate processing space 201B refers to a space in which the wafer 200 is processed by using the plasma, for example, a space below the lower end of the first resonance coil 212. According to the present embodiments, a diameter of the plasma generation space 201A in a horizontal direction is the same as a diameter of the substrate processing space 201B in the horizontal direction. A configuration constituting the plasma generation space 201A may also be referred to as a "plasma generation room", and a configuration constituting the substrate processing space 201B may also be referred to as a "substrate processing room". Further, the plasma generation space 201A may also be referred to as a "plasma generation region" in the process chamber 201, and the substrate processing space 201B may also be referred to as a "substrate processing region" in the process chamber 201.

<Susceptor>

A susceptor (which is a substrate mounting table) 217 serving as a substrate support on which the wafer 200 is placed is provided at a center of a bottom portion of the process chamber 201. The susceptor 217 is provided in the process chamber 201 and below the first resonance coil 212.

A heater 217B serving as a heating structure is integrally embedded in the susceptor 217. When an electric power is supplied to the heater 217B, the heater 217B is configured to heat the wafer 200.

The susceptor 217 is electrically insulated from the lower vessel 211. An impedance adjusting electrode 217C is provided in the susceptor 217 in order to further improve a uniformity of a density of the plasma generated on the wafer 200 placed on the susceptor 217. The impedance adjustment electrode 217C is grounded via a variable impedance regulator 275 serving as an impedance adjusting structure.

A susceptor elevator 268 including a driving structure capable of elevating and lowering the susceptor 217 is provided at the susceptor 217. Through-holes 217A are provided at the susceptor 217, and wafer lift pins 266 are provided on a bottom surface of the lower vessel 211. When the susceptor 217 is lowered by the susceptor elevator 268, the wafer lift pins 266 are configured to penetrate the through-holes 217A without contacting the susceptor 217.

<Gas Supplier>

A gas supply head 236 is provided above the process chamber 201, that is, on an upper portion of the upper vessel 210. The gas supply head 236 includes a cap-shaped lid 233, a gas inlet port 234, a buffer chamber 237, an opening 238, a shield plate 240 and a gas outlet port 239. The gas supply head 236 is configured such that a gas such as a reactive gas is supplied into the process chamber 201 through the gas supply head 236. The buffer chamber 237 functions as a dispersion space in which the gas such as the reactive gas introduced (supplied) through the gas inlet port 234 is dispersed.

A downstream end of an oxygen-containing gas supply pipe 232A through which an oxygen-containing gas is supplied, a downstream end of a hydrogen-containing gas supply pipe 232B through which a hydrogen-containing gas is supplied and a downstream end of an inert gas supply pipe 232C through which an inert gas is supplied are connected to the gas inlet port 234 through a confluence pipe 232. Hereinafter, the oxygen-containing gas supply pipe 232A may also be simply referred to as a "gas supply pipe 232A", the hydrogen-containing gas supply pipe 232B may also be simply referred to as a "gas supply pipe 232B", and the inert gas supply pipe 232C may also be simply referred to as a "gas supply pipe 232C". An oxygen-containing gas supply source 250A, a mass flow controller (MFC) 252A serving as a flow rate controller and a valve 253A serving as an opening/closing valve are sequentially provided at the oxygen-containing gas supply pipe 232A in this order from an upstream side to a downstream side of the oxygen-containing gas supply pipe 232A in a gas flow direction. A hydrogen-containing gas supply source 250B, an MFC 252B and a valve 253B are sequentially provided at the hydrogen-containing gas supply pipe 232B in this order from an upstream side to a downstream side of the hydrogen-containing gas supply pipe 232B in the gas flow direction. An inert gas supply source 250C, an MFC 252C and a valve 253C are sequentially provided at the inert gas supply pipe 232C in this order from an upstream side to a downstream side of the inert gas supply pipe 232C in the gas flow direction. A valve 243A is provided on a downstream side of the confluence pipe 232 where the oxygen-containing gas supply pipe 232A, the hydrogen-containing gas supply pipe 232B and the inert gas supply pipe 232C join. The confluence pipe 232 is connected to an upstream end the gas inlet port 234. It is possible to supply the process gas such as the oxygen-containing gas, the hydrogen-containing gas and the inert gas into the process chamber 201 via the oxygen-containing gas supply pipe 232A, the hydrogen-containing gas supply pipe 232B and the inert gas supply pipe 232C by opening and closing the valves 253A, 253B, 253C and 243A while adjusting flow rates of the respective gases by the MFCs 252A, 252B and 252C.

For example, an oxygen-containing gas supplier (which is an oxygen-containing gas supply structure or an oxygen-containing gas supply system) according to the present embodiments is constituted mainly by the oxygen-containing gas supply pipe 232A, the MFC 252A, the valve 253A and the valve 243A. In addition, a hydrogen-containing gas supplier (which is a hydrogen-containing gas supply structure or a hydrogen-containing gas supply system) according to the present embodiments is constituted mainly by the hydrogen-containing gas supply pipe 232B, the MFC 252B, the valve 253B and the valve 243A. In addition, an inert gas supplier (which is an inert gas supply structure or an inert gas supply system) according to the present embodiments is constituted mainly by the inert gas supply pipe 232C, the MFC 252C, the valve 253C and the valve 243A.

A gas supplier (which is a gas supply structure or a gas supply system) according to the present embodiments is constituted mainly by the oxygen-containing gas supply pipe 232A, the hydrogen-containing gas supply pipe 232B, the inert gas supply pipe 232C, the MFCs 252A, 252B and 252C, the valves 253A, 253B and 253C and the valve 243A. The gas supplier (gas supply system) is configured such that the process gas can be supplied into the process vessel 203. For example, one of the oxygen-containing gas supplier, the hydrogen-containing gas supplier and the inert gas supplier or a combination thereof may also be referred to as the "gas supplier".

<Exhauster>

A gas exhaust port 235 is provided on a side wall of the lower vessel 211. An inner atmosphere of the process chamber 201 (for example, the reactive gas in the process chamber 201) is exhausted through the gas exhaust port 235. An upstream end of a gas exhaust pipe 231 is connected to the gas exhaust port 235. An APC (Automatic Pressure Controller) valve 242 serving as a pressure regulator (pressure adjusting structure), a valve 243B serving as an opening/closing valve and a vacuum pump 246 serving as a vacuum exhaust apparatus are sequentially provided at the gas exhaust pipe 231 in this order from an upstream side to a downstream side of the gas exhaust pipe 231 in the gas flow direction. An exhauster (which is an exhaust structure or an exhaust system) according to the present embodiments is constituted mainly by the gas exhaust port 235, the gas exhaust pipe 231, the APC valve 242 and the valve 243B. The exhauster may further include the vacuum pump 246.

<Plasma Generator>

The first resonance coil 212 and the second resonance coil 214 are respectively arranged on an outer side of the process vessel 203 so as to surround an outer periphery of the process vessel 203. Specifically, the first resonance coil 212 and the second resonance coil 214 are respectively arranged so as to surround an outer periphery of a portion (region) corresponding to the plasma generation space 201A (that is, an outer periphery of the plasma generation room) in the process vessel 203. The first resonance coil 212 is provided by winding a conductor 212A of a line shape or a string shape a plurality of times in a spiral shape in the same direction. Both ends (that is, an upper end 212B and a lower end 212C shown in FIG. 8) of the first resonance coil 212 are grounded, and a portion of the first resonance coil 212 between the upper end 212B and the lower end 212C surrounds the outer periphery of the process vessel 203. Specifically, the first resonance coil 212 surrounds an outer peripheral portion of the process chamber 201, that is, an outer periphery of a side wall of the upper vessel 210. In other words, the process vessel 203 is inserted into an inner side of the first resonance coil 212. In addition, according to the present embodiments, the first resonance coil 212 and the outer periphery (outer surface) of the process vessel 203 are provided close to each other such that a high frequency electromagnetic field generated by the first resonance coil 212 can excite the process gas in the process vessel 203 into the plasma state by the plasma. Further, a winding diameter of the first resonance coil 212 according to the present embodiments is constant and the same at positions on the first resonance coil 212. An RF power is supplied to the first resonance coil 212.

The second resonance coil 214 is provided by winding a conductor 214A of a line shape or a string shape a plurality of times in a spiral shape in the same direction. Both ends (that is, an upper end 214B and a lower end 214C shown in FIG. 8) of the second resonance coil 214 are grounded, and a portion of the second resonance coil 214 between the upper end 214B and the lower end 214C surrounds the outer periphery of the process vessel 203. Specifically, the second resonance coil 214 surrounds the outer peripheral portion of the process chamber 201, that is, the outer periphery of the side wall of the upper vessel 210. In other words, the process vessel 203 is inserted into an inner side of the second resonance coil 214. In addition, according to the present embodiments, similar to the first resonance coil 212, the second resonance coil 214 and the outer periphery (outer surface) of the process vessel 203 are provided close to each other such that a high frequency electromagnetic field generated by the second resonance coil 214 can excite the process gas in the process vessel 203 into the plasma state by the plasma. Further, a winding diameter of the second resonance coil 214 according to the present embodiments is constant and the same at positions on the second resonance coil 214. Further, according to the present embodiments, the winding diameter D1 of the first resonance coil 212 and the winding diameter D2 of the second resonance coil 214 are different. Specifically, the winding diameter D2 of the second resonance coil 214 is set to be greater than the winding diameter D1 of the first resonance coil 212. According to the present embodiments, for example, the winding diameter D2 is preferably set within a range from 101% to 125%, preferably from 105% to 120% of the winding diameter D1.

Figure 7:
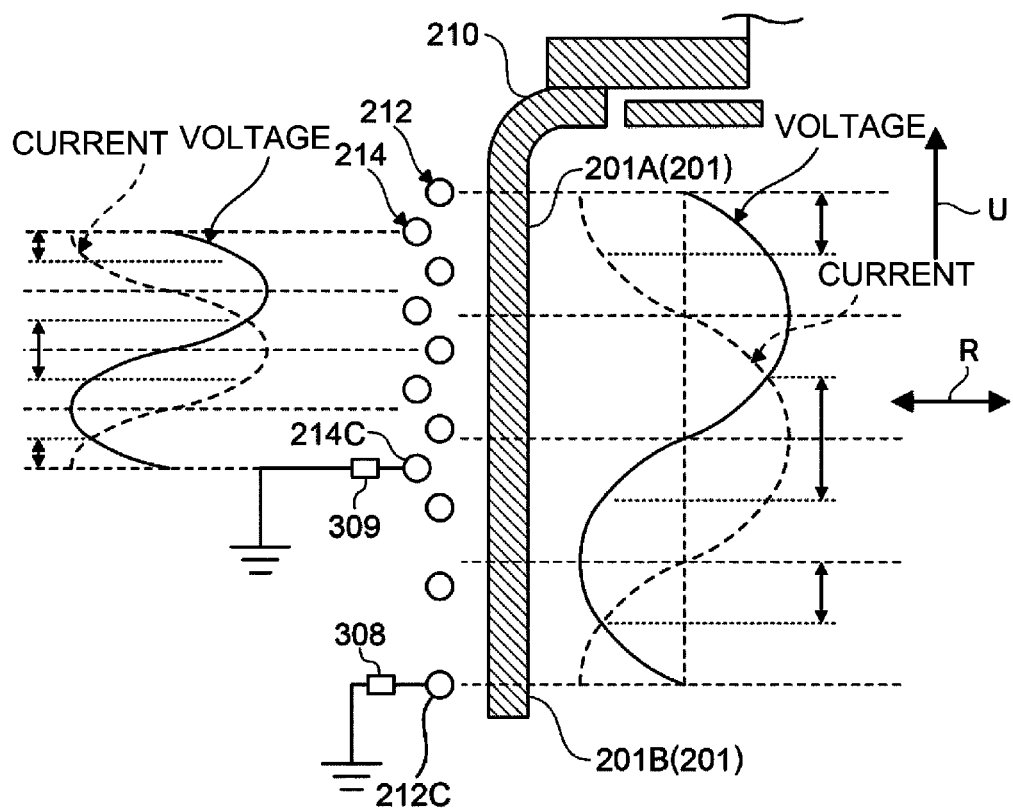
FIG. 7 is a diagram schematically illustrating a relationship between the current and the voltage in the first resonance coil and the second resonance coil.
Figure 8:
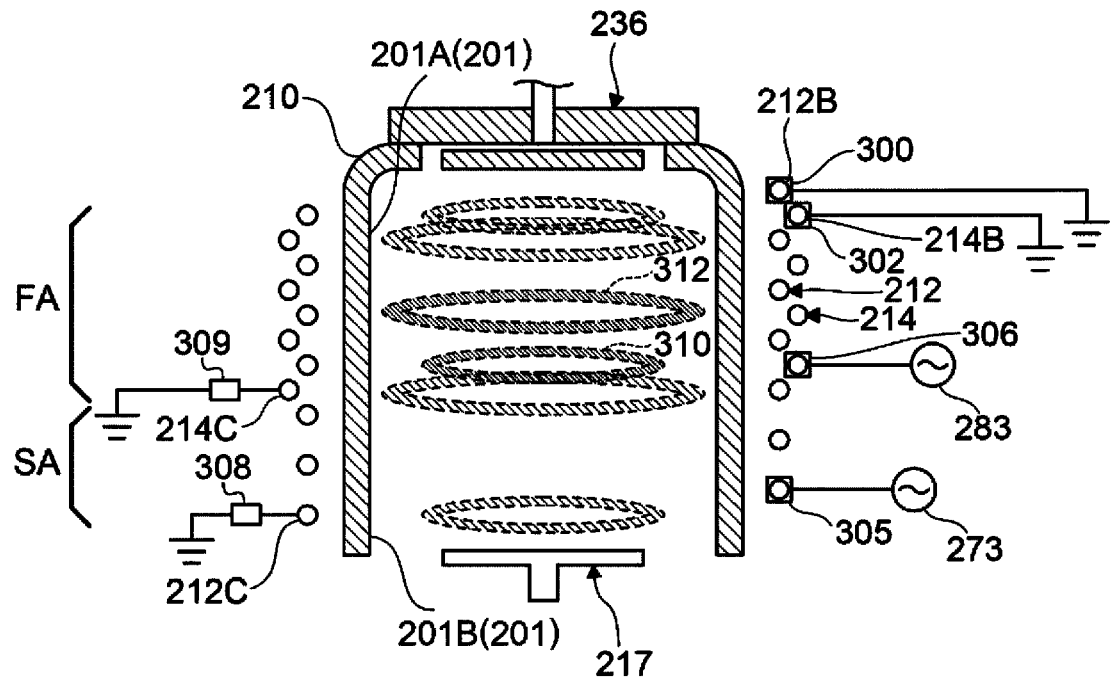
FIG. 8 is a diagram schematically illustrating an internal state of the process furnace when the process gas is excited into the plasma state using the first resonance coil and the second resonance coil shown in FIG. 7.

As shown in FIG. 8, an axial direction of the first resonance coil 212 (that is, a direction along a spiral axis of the first resonance coil 212) and an axial direction of the second resonance coil 214 (that is, a direction along a spiral axis of the second resonance coil 214) are the same direction. That is, the axial direction of the second resonance coil 214 is equal to the axial direction of the first resonance coil 212. More specifically, according to the present embodiments, the spiral axis of the first resonance coil 212 and the spiral axis of the second resonance coil 214 are coaxial. In addition, according to the present embodiments, the axial direction of each resonance coil is the same direction as an up-and-down direction of the substrate processing apparatus 100, that is, the same direction as a vertical direction. In FIG. 7, an upper direction of the substrate processing apparatus 100 is indicated by an arrow "U", and a radial direction of the process vessel 203 is indicated by an arrow "R". According to the present embodiments, the radial direction of the process vessel 203 is the same direction as a horizontal direction of the substrate processing apparatus 100, and is also the same direction as a direction perpendicular to the spiral axis of each resonance coil. Further, the conductor 212A constituting the first resonance coil 212 and the conductor 214A constituting the second resonance coil 214 are alternately arranged in the vertical direction (that is, the axial direction of each resonance coil). According to the present embodiments, for example, when the first resonance coil 212 and the second resonance coil 214 are viewed from the vertical direction, an outer peripheral portion of the first resonance coil 212 overlaps with an inner peripheral portion of the second resonance coil 214. By providing the first resonance coil 212 and the second resonance coil 214 such that a part of the first resonance coil 212 overlaps with a part of the second resonance coil 214 when viewed from the vertical direction, it is possible to suppress an increase in a size of a vessel (not shown) covering each resonance coil in the radial direction. On the other hand, for example, when the first resonance coil 212 and the second resonance coil 214 do not overlap with each other when viewed from the vertical direction, that is, when there is a gap between the first resonance coil 212 and the second resonance coil 214, by securing a distance between the first resonance coil 212 and the second resonance coil 214, it is possible to suppress a generation of an arc discharge. Further, the distance between the first resonance coil 212 and the second resonance coil 214 may be set to a distance in advance such that no arc discharge is generated therebetween. In addition, the RF power is supplied to the second resonance coil 214.

As shown in FIG. 8, an axial length (that is, a length along the spiral axis) of a coil portion of the first resonance coil 212 is set to be longer than an axial length (that is, a length along the spiral axis) of a coil portion of the second resonance coil 214. Therefore, the conductor 212A of the first resonance coil 212 and the conductor 214A of the second resonance coil 214 are alternately arranged in the vertical direction (that is, the axial direction of each resonance coil) from an upper portion to the vicinity of a central portion of the first resonance coil 212 in the vertical direction. According to the present embodiments, a region in which the first resonance coil 212 and the second resonance coil 214 are arranged is provided on the outer periphery of the process vessel 203. Specifically, the region in which the first resonance coil 212 and the second resonance coil 214 are arranged may also be referred to as a "first arrangement region", and is indicated by a reference character "FA" (see FIG. 8). In addition, a region in which the first resonance coil 212 is arranged and the second resonance coil 214 is not arranged may be referred to as a "second arrangement region", and is indicated by a reference character "SA" (see FIG. 8). The second arrangement region SA is provided closer to the susceptor 217 than the first arrangement region FA in the up-and-down direction of the substrate processing apparatus 100 (that is, the vertical direction).

An RF (Radio Frequency) sensor 272, an RF power supply 273 and a matcher (which is a matching structure) 274 configured to perform an impedance matching or an output frequency matching for the RF power supply 273 are connected to the first resonance coil 212.

The RF power supply 273 is configured to supply the RF power to the first resonance coil 212. The RF sensor 272 is provided at an output side of the RF power supply 273. The RF sensor 272 is configured to monitor information of the traveling wave or reflected wave of the RF power supplied from the RF power supply 273. The information of the reflected wave monitored by the RF sensor 272 is input to the matcher 274, and the matcher 274 is configured to match (or adjust) an impedance or a frequency of the RF power output from the RF power supply 273 so as to minimize the reflected wave based on the information of the reflected wave input from the RF sensor 272.

The RF power supply 273 includes a power supply controller (which is a control circuit) (not shown) and an amplifier (which is an output circuit) (not shown). The power supply controller includes a high frequency oscillation circuit (not shown) and a preamplifier (not shown) in order to adjust an oscillation frequency and an output. The amplifier amplifies the output to a predetermined output level. The power supply controller controls the amplifier based on output conditions relating to the frequency and the power, which are set in advance through an operation panel (not shown), and the amplifier supplies a constant RF power to the first resonance coil 212 via a transmission line. The RF sensor 272 and the matcher 274 are collectively referred to as a "RF power supplier 271" which is a RF power supply structure or a RF power supply system. The RF power supplier 271 may further include the RF power supply 273.

An RF (Radio Frequency) sensor 282, a RF power supply 283 and a matcher (which is a matching structure) 284 configured to perform an impedance matching or an output frequency matching for the RF power supply 283 are connected to the second resonance coil 214.

The RF power supply 283 is configured to supply the RF power to the second resonance coil 214. The RF sensor 282 is provided at an output side of the RF power supply 283. The RF sensor 282 is configured to monitor information of the traveling wave or reflected wave of the RF power supplied from the RF power supply 283. The information of the reflected wave monitored by the RF sensor 282 is input to the matcher 284, and the matcher 284 is configured to match (or adjust) an impedance or a frequency of the RF power output from the RF power supply 283 so as to minimize the reflected wave based on the information of the reflected wave input from the RF sensor 282.

The RF power supply 283 includes a power supply controller (which is a control circuit) (not shown) and an amplifier (which is an output circuit) (not shown). The power supply controller includes a high frequency oscillation circuit (not shown) and a preamplifier (not shown) in order to adjust an oscillation frequency and an output. The amplifier amplifies the output to a predetermined output level. The power supply controller controls the amplifier based on output conditions relating to the frequency and the power, which are set in advance through the operation panel (not shown), and the amplifier supplies a constant RF power to the second resonance coil 214 via a transmission line. The RF sensor 282 and the matcher 284 are collectively referred to as a "RF power supplier 281" which is a RF power supply structure or an RF power supply system. The RF power supplier 281 may further include the RF power supply 283.

The winding diameter, a winding pitch and the number of winding turns of the first resonance coil 212 are set such that the first resonance coil 212 resonates at a constant wavelength to form a standing wave of a predetermined wavelength. That is, an electrical length of the first resonance coil 212 is set to an integral multiple (n times, where n is equal to or greater than 1) of a wavelength of a predetermined frequency of the RF power supplied from the RF power supply 273.

In addition, the winding diameter, a winding pitch and the number of winding turns of the second resonance coil 214 are set such that the second resonance coil 214 resonates at a constant wavelength to form a standing wave of a predetermined wavelength. That is, an electrical length of the second resonance coil 214 is set to an integral multiple (n times, where n is equal to or greater than 1) of a wavelength of a predetermined frequency of the RF power supplied from the RF power supply 283.

Specifically, considering conditions such as the power to be applied, a strength of a magnetic field to be generated and a shape of the substrate processing apparatus 100 to be applied, the first resonance coil 212 is set such that, for example, the magnetic field of about 0.01 Gauss to about 10 Gauss can be generated by the RF power whose frequency is from 800 kHz to 50 MHz and whose power is from 0.1 kW to 5 kW. For example, the first resonance coil 212 whose effective cross-section is from 50 mm2 to 300 mm2 and whose diameter is from 200 mm to 500 mm is wound, for example, twice to 60 times around an outer circumferential side of the process chamber 201 defining the plasma generation space 201A. Similarly, considering conditions such as the power to be applied, a strength of a magnetic field to be generated and a shape of the substrate processing apparatus 100 to be applied, the second resonance coil 214 is set such that, for example, the magnetic field of about 0.01 Gauss to about 10 Gauss can be generated by the RF power whose frequency is from 800 kHz to 50 MHz and whose power is from 0.1 kW to 5 kW. For example, the second resonance coil 214 whose effective cross-section is from 50 mm2 to 300 mm2 and whose diameter is from 200 mm to 500 mm is wound, for example, twice to 60 times around the outer circumferential side of the process chamber 201 defining the plasma generation space 201A.

As shown in FIG. 7, the first resonance coil 212 and the second resonance coil 214 are arranged such that a position of an anti-node of the standing wave by the first resonance coil 212 and a position of an anti-node of the standing wave by the second resonance coil 214 do not overlap with each other. In other words, a peak of a voltage distribution of the first resonance coil 212 and a peak of a voltage distribution of the second resonance coil 214 do not overlap with each other. Further, the distance between the first resonance coil 212 and the second resonance coil 214 is set to the distance at which no arc discharge is generated between the conductor 212A of the first resonance coil 212 and the conductor 214A of the second resonance coil 214.

For example, a copper pipe, a copper thin plate, an aluminum pipe, an aluminum thin plate and a material obtained by depositing copper or aluminum on a polymer belt may be used as a material constituting each of the first resonance coil 212 and the second resonance coil 214. Each of the first resonance coil 212 and the second resonance coil 214 is supported by a plurality of supports (not shown) of a plate shape and made of an insulating material, which are provided on an upper end surface of a base plate 248 so as to extend vertically.

The both ends of the first resonance coil 212 are electrically grounded. One end of the first resonance coil 212 (for example, the upper end 212B shown in FIGS. 2, 4 and 8) is grounded via a movable tap 300 in order to fine-tune the electrical length of the first resonance coil 212 when the substrate processing apparatus 100 is newly installed or process conditions of the substrate processing apparatus 100 are changed, and the other end of the first resonance coil 212 (for example, the lower end 212C shown in FIGS. 1 through 4, 7 and 8) is grounded as a fixed ground. In addition, in order to fine-tune impedance (or the electrical length) of the first resonance coil 212 when the substrate processing apparatus 100 is newly installed or the process conditions of the substrate processing apparatus 100 are changed, a power feeder (not shown) is constituted by a movable tap 305 between the grounded ends of the first resonance coil 212. Further, a position of the movable tap 305 may be adjusted in order for the resonance characteristics of the first resonance coil 212 to become approximately the same as those of the RF power supply 273. Since the first resonance coil 212 includes a variable ground structure (that is, the movable tap 300) and a variable power supply feeding structure (that is, the power feeder constituted by the movable tap 305), it is possible to easily adjust a resonance frequency and a load impedance of the process chamber 201. The upper end 212B of the first resonance coil 212 according to the present embodiments is an example of a first ground connection portion according to the technique of the present disclosure. Further, the lower end 212C of the first resonance coil 212 according to the present embodiments is an example of a second ground connection portion according to the technique of the present disclosure. When the vicinity of the upper end 212B of the first resonance coil 212 is grounded, a location in the vicinity of the upper end 212B becomes a grounding point and serves as the first ground connection portion. In addition, when the vicinity of the lower end 212C of the first resonance coil 212 is grounded, a location in the vicinity of the lower end 212C becomes a grounding point and serves as the second ground connection portion.

The both ends of the second resonance coil 214 are electrically grounded. One end of the second resonance coil 214 (for example, the upper end 214B shown in FIGS. 6 and 8) is grounded via a movable tap 302 in order to fine-tune the electrical length of the second resonance coil 214 when the substrate processing apparatus 100 is newly installed or the process conditions of the substrate processing apparatus 100 are changed, and the other end of the second resonance coil 214 (for example, the lower end 214C shown in FIGS. 1, 6, 7 and 8) is grounded as a fixed ground. In addition, in order to fine-tune the impedance (or the electrical length) of the second resonance coil 214 when the substrate processing apparatus 100 is newly installed or the process conditions of the substrate processing apparatus 100 are changed, a power feeder (not shown) is constituted by a movable tap 306 between the grounded ends of the second resonance coil 214. Further, a position of the movable tap 306 may be adjusted in order for the resonance characteristics of the second resonance coil 214 to become approximately the same as those of the RF power supply 283. Since the second resonance coil 214 includes a variable ground structure (that is, the movable tap 302) and a variable power supply feeding structure (that is, the power feeder constituted by the movable tap 306), it is possible to easily adjust the resonance frequency and the load impedance of the process chamber 201. The upper end 214B of the second resonance coil 214 according to the present embodiments is an example of a third ground connection portion according to the technique of the present disclosure. Further, the lower end 214C of the second resonance coil 214 according to the present embodiments is an example of a fourth ground connection portion according to the technique of the present disclosure. When the vicinity of the upper end 214B of the second resonance coil 214 is grounded, a location in the vicinity of the upper end 214B becomes a grounding point and serves as the third ground connection portion. In addition, when the vicinity of the lower end 214C of the second resonance coil 214 is grounded, a location in the vicinity of the lower end 214C becomes a grounding point and serves as the fourth ground connection portion.

A waveform adjustment circuit 308 constituted by a resonance coil (not shown) and a shield (not shown) is inserted into one end (or the other end or the both ends) of the first resonance coil 212 so that the phase current and the opposite phase current flow symmetrically with respect to an electrical midpoint of the first resonance coil 212. The waveform adjustment circuit 308 is configured to be open by setting the first resonance coil 212 to an electrically disconnected state or an electrically equivalent state. In addition, an end portion of the first resonance coil 212 may be non-grounded by a choke series resistor, or may be DC-connected to a fixed reference potential.

In addition, a waveform adjustment circuit 309 constituted by a resonance coil (not shown) and a shield (not shown) is inserted into one end (or the other end or the both ends) of the second resonance coil 214 so that the phase current and the opposite phase current flow symmetrically with respect to an electrical midpoint of the second resonance coil 214. The waveform adjustment circuit 309 is configured to be open by setting the second resonance coil 214 to an electrically disconnected state or an electrically equivalent state. In addition, an end portion of the second resonance coil 214 may be non-grounded by a choke series resistor, or may be DC-connected to a fixed reference potential.

For example, the waveform adjustment circuit 308 or 309 may be arranged on at least one of the first resonance coil 212 or the second resonance coil 214. According to the present embodiments, as the waveform adjustment circuit 308 or 309, for example, a variable capacitor may be used, or a wire (coil) made of a conductor may be used.

A shield plate 223 is provided to shield an electric field outside of the first resonance coil 212 and/or the second resonance coil 214 and to form a capacitive component (also referred to as a "C component") of the first resonance coil 212 or the second resonance coil 214 appropriate for constructing a resonance circuit between the shield plate 223 and the first resonance coil 212 or between the shield plate 223 and the second resonance coil 214. In general, the shield plate 223 is made of a conductive material such as an aluminum alloy, and is of a cylindrical shape. The shield plate 223 is disposed, for example, about 5 mm to 150 mm apart from an outer periphery of each of the first resonance coil 212 and the second resonance coil 214.

A first plasma generator according to the present embodiments is constituted mainly by the first resonance coil 212, the RF sensor 272 and the matcher 274. In addition, the first plasma generator may further include the RF power supply 273. Further, a second plasma generator according to the present embodiments is constituted mainly by the second resonance coil 214, the RF sensor 282 and the matcher 284. In addition, the second plasma generator may further include the RF power supply 283. The first plasma generator and the second plasma generator may be collectively referred to as a "plasma generator".

Hereinafter, a principle of generating the plasma in the substrate processing apparatus 100 of the present embodiments and the properties of the generated plasma will be described. Since the principles of generating the plasma by each of the first resonance coil 212 and the second resonance coil 214 are the same, the principle of generating the plasma by the first resonance coil 212 will be described hereafter as an example (see FIGS. 3 through 5).

A plasma generation circuit constituted by the first resonance coil 212 is configured as an RLC parallel resonance circuit. When the wavelength of the RF power supplied from the RF power supply 273 and the electrical length of the first resonance coil 212 are the same, the resonance condition of the first resonance coil 212 is that a reactance component generated by a capacitance component or an inductive component of the first resonance coil 212 is canceled out to become a pure resistance. However, when the plasma is generated in the plasma generation circuit described above, an actual resonance frequency may fluctuate slightly depending on conditions such as a variation (change) in a capacitive coupling between a voltage portion of the first resonance coil 212 and the plasma, a variation in an inductive coupling between the plasma generation space 201A and the plasma and an excitation state of the plasma.

Therefore, in the substrate processing apparatus 100 according to the present embodiments, in order to compensate for a resonance shift in the first resonance coil 212 when the plasma is generated by adjusting the power supplied from the RF power supply 273, the RF sensor 272 is configured to detect the power of the reflected wave from the first resonance coil 212 when the plasma is generated, and the matcher 274 is configured to correct the output of the RF power supply 273 based on the detected power of the reflected wave.

Specifically, the matcher 274 is configured to increase or decrease the impedance or the output frequency of the RF power supply 273 such that the power of the reflected wave is minimized based on the power of the reflected wave from the first resonance coil 212 detected by the RF sensor 272 when the plasma is generated. In case the impedance is controlled by the matcher 274, the matcher 274 is constituted by a variable capacitor control circuit (not shown) capable of correcting a preset impedance. In case the output frequency of the RF power supply 273 is controlled by the matcher 274, the matcher 274 is constituted by a frequency control circuit (not shown) capable of correcting a preset oscillation frequency of the RF power supply 273. For example, the RF power supply 273 and the matcher 274 may be provided integrally as a single body.

Figure 4:
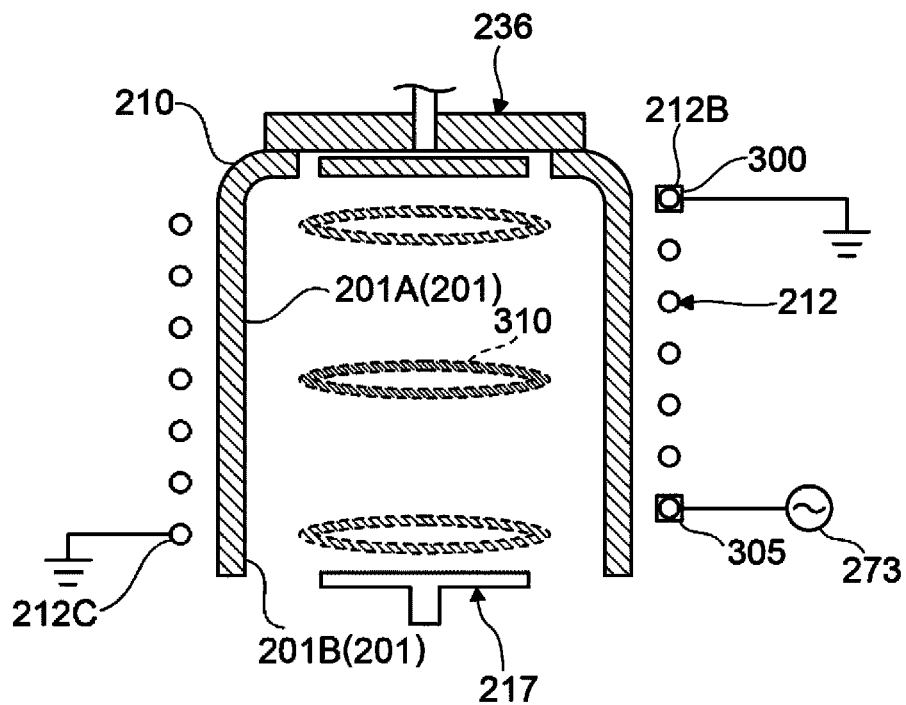
FIG. 4 is a diagram schematically illustrating an internal state of a process furnace when a process gas is excited into a plasma state using the first resonance coil shown in FIG. 2.
Figure 5:
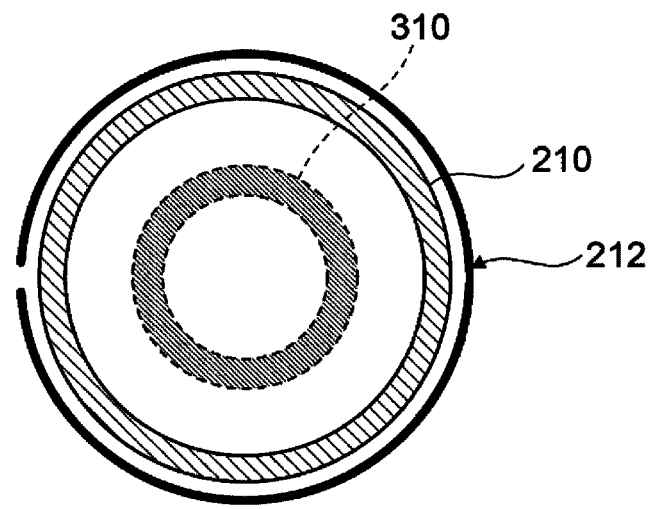
FIG. 5 is a diagram schematically illustrating a horizontal cross-section of the process furnace at a central portion of the first resonance coil shown in FIG. 4 in an axial direction.
Figure 6:
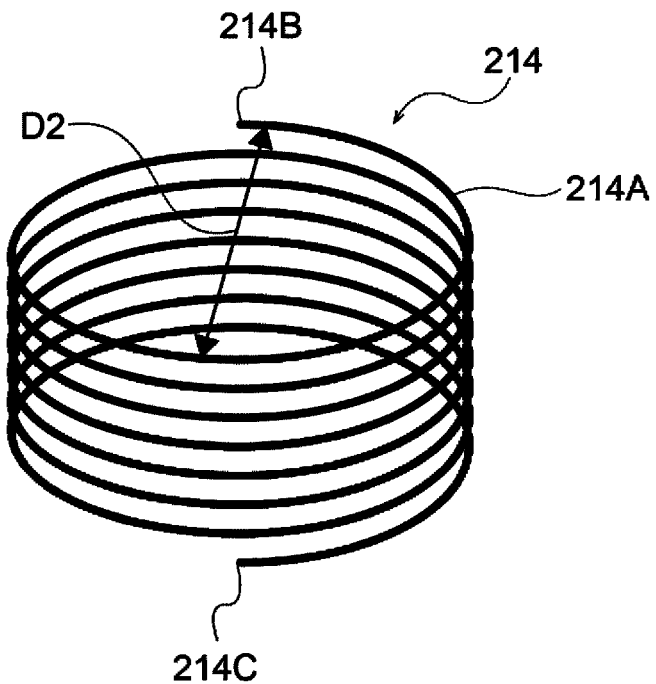
FIG. 6 is a diagram schematically illustrating a second resonance coil preferably used in the embodiments of the present disclosure.

According to the configuration related to the first resonance coil 212 according to the present embodiments, the RF power whose frequency is equal to the actual resonance frequency of the first resonance coil 212 combined with the plasma is supplied to the first resonance coil 212 (or the RF power is supplied to match an actual impedance of the first resonance coil 212 combined with the plasma). Therefore, the standing wave in which the phase voltage thereof and the opposite phase voltage thereof are always canceled out by each other is generated in the first resonance coil 212 (see FIG. 3). For example, when the wavelength of the RF power and the electrical length of the first resonance coil 212 are the same, the highest phase current is generated at an electrical midpoint of the first resonance coil 212 (node with zero voltage). Specifically, when the RF power is supplied from the RF power supply 273 to the first resonance coil 212, for example, a current standing wave and a voltage standing wave whose wavelengths are equal to the wavelength of the RF power supplied from the RF power supply 273 are generated between both ends of a line of the first resonance coil 212. Among waveforms on a right portion of FIG. 3, a broken line illustrates the current and a solid line illustrates the voltage. As shown by the waveform on the right portion of FIG. 3, an amplitude of the current standing wave is maximized at the both ends of the first resonance coil 212 and a midpoint (that is, the electrical midpoint) of the first resonance coil 212. Therefore, a donut-shaped induction plasma (which is an inductively coupled plasma (ICP)) 310 of an extremely low electric potential is generated in the vicinity of the electrical midpoint of the first resonance coil 212. The donut-shaped ICP 310 is hardly capacitively coupled with walls of the process chamber 201 or the susceptor 217. Specifically, a high frequency magnetic field is generated in the vicinity of the electrical midpoint of the first resonance coil 212 where the amplitude of the current standing wave is maximized, and a plasma discharge of the process gas supplied into the plasma generation space 201A in the upper vessel 210 is generated by a high frequency electromagnetic field induced by the high frequency magnetic field. The plasma of the process gas is generated in the vicinity of the electrical midpoint of the first resonance coil 212 by exciting the process gas discharged by the high frequency electromagnetic field. Hereinafter, the plasma of the process gas generated by the high frequency electromagnetic field generated in the vicinity of a location (region) where the amplitude of the current is great as described above may also be referred to as the "ICP". As shown in FIG. 4, the ICP is generated in a donut shape in a region in the vicinity of the electrical midpoint of the first resonance coil 212 in a space along an inner wall surface of the upper vessel 210. Thereby, the ICP whose plasma density is uniform in a direction parallel to a surface of the wafer 200 can be generated. Similarly, the induction plasma is also generated at the both axial ends of the first resonance coil 212 according to the same principle.

Subsequently, an internal state of the process furnace 202 when the plasma is generated using the first resonance coil 212 and the second resonance coil 214 will be described.

In the substrate processing apparatus 100 according to the present embodiments shown in FIG. 8, the first resonance coil 212 and the second resonance coil 214 are respectively provided around the plasma generation space 201A, similar to a case where the first resonance coil 212 alone is provided as shown in FIG. 4. For example, when the RF power is supplied to the first resonance coil 212 while the process gas is supplied to the plasma generation space 201A, the voltage and the current are generated as shown on a right portion of FIG. 7 by the principle described above, and the ICP 310 is generated in the plasma generation space 201A as shown in FIG. 8.

Similarly, when the RF power is supplied to the second resonance coil 214 while the process gas is supplied to the plasma generation space 201A, the voltage and the current are generated as shown on a left portion of FIG. 7 by the principle described above, and an ICP 312 is generated in the plasma generation space 201A as shown in FIG. 8.

By using a plurality of resonance coils (for example, the first resonance coil 212 and the second resonance coil 214), it is possible to generate a large amount of the plasma as compared with a case where a single resonance coil (for example, the first resonance coil 212 alone) is used to generate the plasma. That is, it is possible to generate a large amount of radical components in the plasma.

According to the present embodiments, the winding diameter D2 of the second resonance coil 214 is set to be different from the winding diameter D1 of the first resonance coil 212. Therefore, as shown in FIG. 7, the peak of the voltage distribution of the first resonance coil 212 and the peak of the voltage distribution of the second resonance coil 214 are displaced with each other in the radial direction. That is, the peak of the voltage distribution of the first resonance coil 212 and the peak of the voltage distribution of the second resonance coil 214 do not overlap with each other. By making the peaks of the voltage distributions of the two resonance coils (that is, the first resonance coil 212 and the second resonance coil 214) to be apart from each other as described above, it is possible to uniformize a density of the highly concentrated induction plasma along the radial direction (see FIG. 9). Thereby, it is possible to realize a uniformity of the density of induction plasma on a surface of the substrate (that is, on the surface of the wafer 200).

Figure 9:
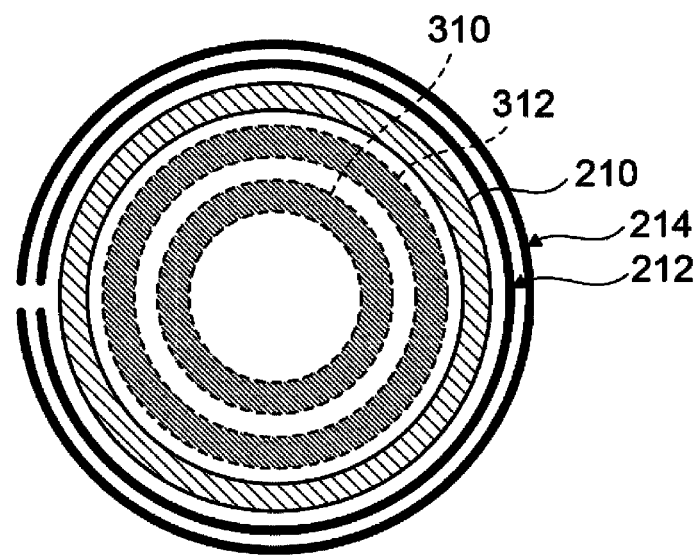
FIG. 9 is a diagram schematically illustrating a horizontal cross-section of the process furnace at central portions of the first resonance coil and the second resonance coil shown in FIG. 8 in the axial direction.

Further, the second resonance coil 214 according to the present embodiments is configured such that, in the direction (horizontal direction) perpendicular to the axial direction, the peak of the voltage distribution thereof does not overlap with the peak of the voltage distribution of the first resonance coil 212. By making the peaks of the voltage distributions of the two resonance coils in the horizontal direction to be apart from each other as described above, it is possible to uniformize the density of the plasma. For example, as shown in FIG. 9, by separately forming the ICPs (that is, the ICP 310 and the ICP 312) using the two resonance coils, it is possible to increase an amount of the plasma in the radial direction.

Further, the second resonance coil 214 according to the present embodiments is configured such that, in the axial direction (vertical direction), the peak of the voltage distribution thereof does not overlap with the peak of the voltage distribution of the first resonance coil 212. By making the peaks of the voltage distributions of the two resonance coils in the vertical direction to be apart from each other as described above, it is possible to supplement a state of one induction plasma by the other induction plasma. Therefore, it is possible to extend a lifetime of the entirety of the induction plasma.

Further, according to the present embodiments, the first arrangement region FA and the second arrangement region SA are provided on the outer periphery of the process vessel 203. In addition, the first resonance coil 212 alone is continuously arranged in the second arrangement region SA. Therefore, it is possible to adjust a physical length of a coil length with respect to the plasma generation space 201A. Thereby, it is possible to secure a flexibility in the design.

Further, according to the present embodiments, the winding diameter D1 of the first resonance coil 212 is set to be smaller than the winding diameter D2 of the second resonance coil 214. It is possible to form the peak of the voltage distribution using the first resonance coil 212 with the winding diameter D1 smaller than the winding diameter D2 of the second resonance coil 214. Thereby, it is possible to supply the induction plasma whose density is high to a central region of the substrate (that is, the wafer 200).

Further, the second arrangement region SA according to the present embodiments is provided closer to the susceptor 217 on which the wafer 200 is placed in the process vessel 203 than the first arrangement region FA in the axial direction (vertical direction). According to the present embodiments, for example, by reducing the winding diameter of the resonance coil provided closer to the susceptor 217 (that is, by reducing the winding diameter D1 of the first resonance coil 212), it is possible to easily supply the plasma to the central region of the wafer 200 directly below the resonance coil provided closer to the susceptor 217.

Further, the process vessel 203 according to the present embodiments is provided with the exhauster capable of exhausting the process gas from the outer periphery of the susceptor 217. As a result, it is possible to diffuse a flow of the induction plasma supplied to the central region of the wafer 200 toward the outer periphery of the susceptor 217. That is, it is possible to diffuse the plasma whose density is high supplied to the central region of the wafer 200 in an outer peripheral direction, and therefore, it is possible to uniformize a processing of the wafer 200 on the surface of the wafer 200.

Further, according to the present embodiments, in the first arrangement region FA, the conductor 212A of the first resonance coil 212 and the conductor 214A of the second resonance coil 214 are separated from each other at the distance such that no arc discharge is generated therebetween. Further, in the second arrangement region SA, the conductor 212A of the first resonance coil 212 is provided such that no arc discharge is generated between portions of the conductor 212A wounded the plurality of times with a gap. For example, when a voltage difference between the resonance coils is equal to or greater than a threshold value, the arc discharge may be generated therebetween, and thereby, the electric power may leak. When the electric power leaks, a desired induction plasma cannot be provided. On the other hand, according to the present embodiments, the conductor 212A and the conductor 214A are separated from each other at the distance such that no arc discharge is generated therebetween. Thereby, it is possible to suppress a leakage of the electric power. As a result, it is possible to provide the desired induction plasma.

Further, the first resonance coil 212 according to the present embodiments is configured such that the electrical length between the both ends thereof grounded is a multiple of the wavelength of the RF power supplied to the first resonance coil 212. By grounding the both ends of the first resonance coil 212 as described above, it is possible to provide the multiple of the wavelength of the RF power supplied to the first resonance coil 212. Thereby, it is possible to provide a sine curve of the voltage shown in FIG. 7. As a result, it is possible to easily control the peak of the voltage distribution of the first resonance coil 212.

Further, the second resonance coil 214 according to the present embodiments is configured such that the electrical length between the both ends thereof grounded is a multiple of the wavelength of the RF power supplied to the second resonance coil 214. By grounding the both ends of the second resonance coil 214 as described above, it is possible to provide the multiple of the wavelength of the RF power supplied to the second resonance coil 214. Thereby, it is possible to provide a sine curve of the voltage shown in FIG. 7. As a result, it is possible to easily control the peak of the voltage distribution of the second resonance coil 214.

Further, according to the present embodiments, the waveform adjustment circuits 308 and 309 configured to correct the electrical length are connected to the first resonance coil 212 and the second resonance coil 214, respectively, such that the electrical length of the first resonance coil 212 and the electrical length of the second resonance coil 214 are equal to each other. When the electrical lengths described above cannot be adjusted by grounding, the electrical lengths can be adjusted by using the waveform adjustment circuits 308 and 309 as described above.

Further, according to the present embodiments, a position of the grounded upper end 212B of the first resonance coil 212 in the vertical direction is set to be different from a position of the grounded upper end 214B of the second resonance coil 214. By setting grounding heights of the upper ends of the resonance coils different from each other as described above, it is possible to more reliably make positions of the peaks of the voltage distributions to be more reliably spaced apart from each other.

Further, according to the present embodiments, a position of the grounded lower end 212C of the first resonance coil 212 in the vertical direction is set to be different from a position of the grounded lower end 214C of the second resonance coil 214. By setting grounding heights of the lower ends of the resonance coils different from each other as described above, it is possible to more reliably make the positions of the peaks of the voltage distributions to be more reliably spaced apart from each other.

Further, according to the present embodiments, the frequency of the RF power generated from the RF power supply 273 connected to the first resonance coil 212 is the same as the frequency of the RF power generated from the RF power supply 283 connected to the second resonance coil 214. When the frequencies of the RF power supply 273 and the RF power supply 283 are the same as described above, it is possible to set the wavelengths of the RF power supply 273 and the RF power supply 283 to be the same. As a result, it is possible to easily control the positions of the peaks of the voltage distributions.

Further, according to the present embodiments, a controller 221 described later controls components constituting the substrate processing apparatus 100 to supply the process gas into the process chamber 201 while supplying the RF power to the first resonance coil 212 and the second resonance coil 214. Thereby, it is possible to generate two types of the induction plasma in the plasma generation space 201A. As a result, it is possible to more reliably uniformize the induction plasma.

<Controller>

The controller 221 serving as a control structure is configured to control the components constituting the substrate processing apparatus 100. For example, the controller 221 is configured to control the APC valve 242, the valve 243B and the vacuum pump 246 via a signal line "A" shown in FIG. 1. For example, the controller 221 is configured to control the susceptor elevator 268 via a signal line "B" shown in FIG. 1. For example, the controller 221 is configured to control a heater power regulator 276 and the variable impedance regulator 275 via a signal line "C" shown in FIG. 1. For example, the controller 221 is configured to control the gate valve 244 via a signal line "D" shown in FIG. 1. For example, the controller 221 is configured to control the RF sensor 272, the RF power supply 273, the matcher 274, the RF sensor 282, the RF power supply 283 and the matcher 284 via a signal line "E" shown in FIG. 1. For example, the controller 221 is configured to control the MFCs 252A, 252B and 252C, the valves 253A, 253B and 253C and the valve 243A via a signal line "F" shown in FIG. 1.

Figure 10:
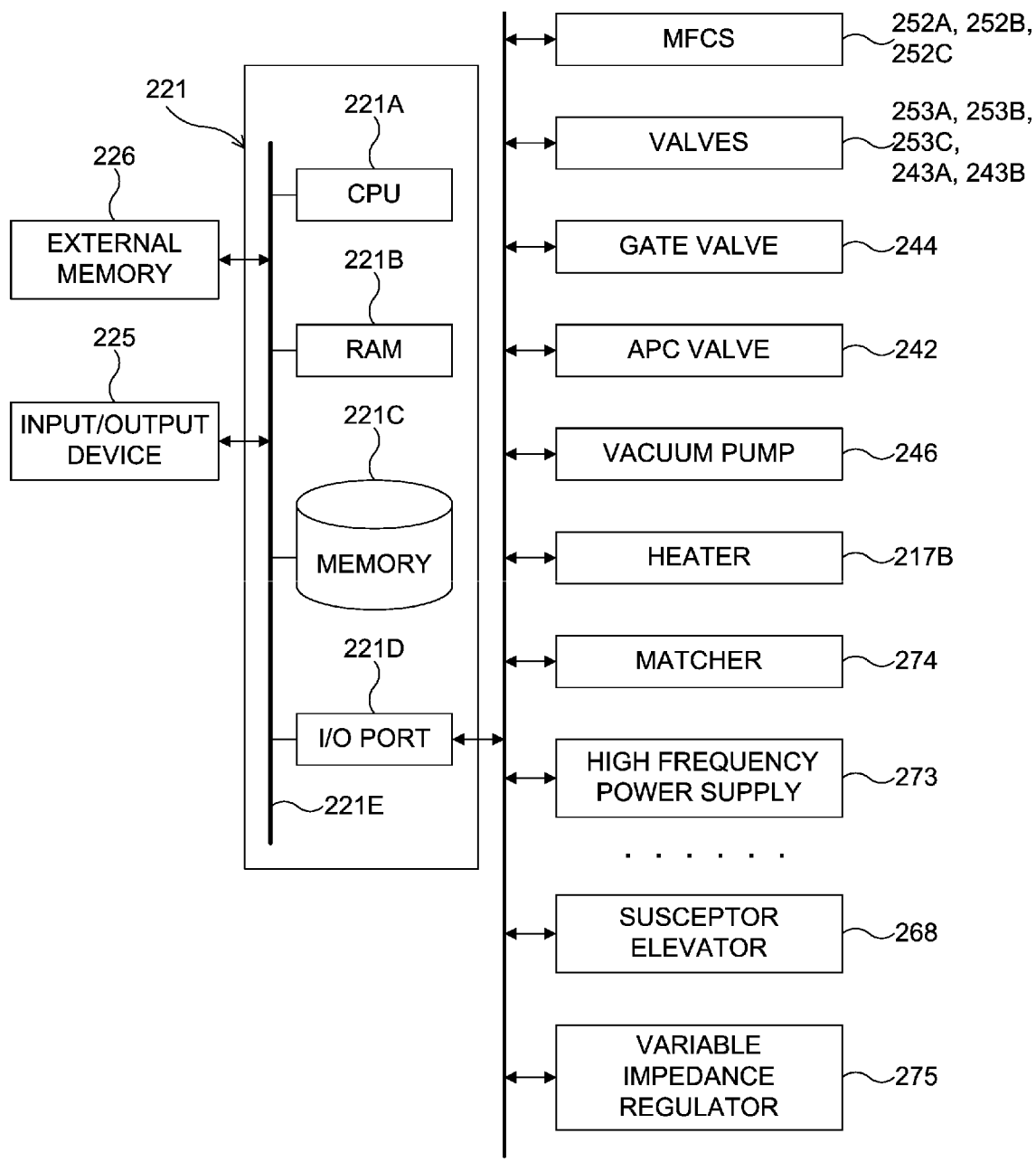
FIG. 10 is a block diagram schematically illustrating a configuration of a controller (which is a control structure) and related components of the substrate processing apparatus preferably used in the embodiments of the present disclosure.

As shown in FIG. 10, the controller 221 (control structure) is constituted by a computer including a CPU (Central Processing Unit) 221A, a RAM (Random Access Memory) 221B, a memory 221C and an I/O port 221D. The RAM 221B, the memory 221C and the I/O port 221D may exchange data with the CPU 221A through an internal bus 221E. For example, an input/output device 225 constituted by components such as a touch panel and a display may be connected to the controller 221.

For example, the memory 221C is configured by a component such as a flash memory and a hard disk drive (HDD). For example, a control program configured to control the operation of the substrate processing apparatus 100 or a process recipe containing information on the sequences and conditions of the substrate processing described later is readably stored in the memory 221C. The process recipe is obtained by combining steps of the substrate processing described later such that the controller 221 can execute the steps to acquire a predetermined result, and functions as a program. Hereinafter, the process recipe and the control program are collectively or individually referred to as a "program". Thus, in the present specification, the term "program" may refer to the process recipe alone, may refer to the control program alone, or may refer to both of the process recipe and the control program. The RAM 221B functions as a memory area (work area) where a program or data read by the CPU 221A is temporarily stored.

The I/O port 221D is electrically connected to the components described above such as the MFCs 252A through 252C, the valves 253A through 253C, the valves 243A and 243B, the gate valve 244, the APC valve 242, the vacuum pump 246, the RF sensor 272, the RF power supply 273, the matcher 274, the RF sensor 282, the RF power supply 283, the matcher 284, the susceptor elevator 268, the variable impedance regulator 275 and the heater power regulator 276.

The CPU 221A is configured to read and execute the control program stored in the memory 221C, and to read the process recipe stored in the memory 221C in accordance with an instruction such as an operation command inputted via the input/output device 225. The CPU 221A is configured to control the operation of the substrate processing apparatus 100 according to the read process recipe. For example, the CPU 221A is configured to perform an operation of adjusting an opening degree of the APC valve 242, an opening and closing operation of the valve 243B and a start and stop of the vacuum pump 246 via the I/O port 221D and the signal line A according to the read process recipe. For example, the CPU 221A is configured to perform an elevating and lowering operation of the susceptor elevator 268 via the signal line B according to the read process recipe. For example, the CPU 221A is configured to perform a power supply amount adjusting operation (temperature adjusting operation) on the heater 217B by the heater power regulator 276 and an impedance adjusting operation by the variable impedance regulator 275 via the signal line C according to the read process recipe. For example, the CPU 221A is configured to perform an opening and closing operation of the gate valve 244 via the signal line D according to the read process recipe. For example, the CPU 221A is configured to perform a controlling operation of the RF sensor 272, the matcher 274, the RF power supply 273, the RF sensor 282, the matcher 284 and the RF power supply 283 via the signal line E according to the read process recipe. For example, the CPU 221A is configured to perform flow rate adjusting operations for various gases by the MFCs 252A, 252B and 252C and opening and closing operations of the valves 253A, 253B, 253C and 243A via the signal line F according to the read process recipe. The CPU 221A may control operations of components of the substrate processing apparatus 100 other than the components described above.

The controller 221 may be embodied by installing the above-described program stored in an external memory 226 into a computer. For example, the external memory 226 may include a magnetic tape, a magnetic disk such as a flexible disk and a hard disk, an optical disk such as a CD and a DVD, a magneto-optical disk such as an MO and a semiconductor memory such as a USB memory and a memory card. The memory 221C or the external memory 226 may be embodied by a non-transitory computer readable recording medium. Hereafter, the memory 221C and the external memory 226 are collectively or individually referred to as a "recording medium". In the present specification, the term "recording medium" may refer to the memory 221C alone, may refer to the external memory 226 alone, and may refer to both of the memory 221C and the external memory 226. Instead of the external memory 226, a communication means such as the Internet and a dedicated line may be used for providing the program to the computer.

(2) Substrate Processing

Figure 11:
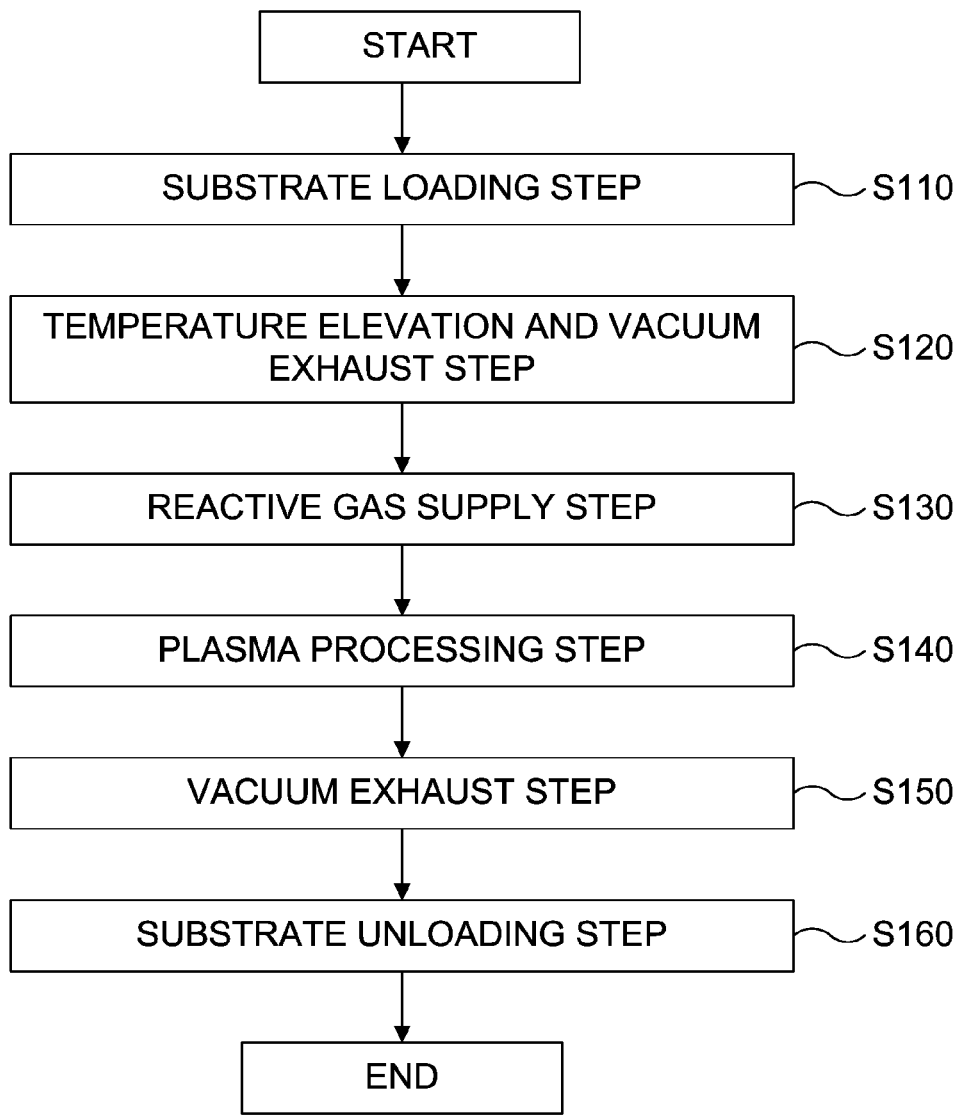
FIG. 11 is a flow chart schematically illustrating a substrate processing preferably used in the embodiments of the present disclosure.

Subsequently, the substrate processing according to the present embodiments will be described with reference to FIG. 11. FIG. 11 is a flowchart schematically illustrating the substrate processing according to the present embodiments. For example, the substrate processing, which is a part of a manufacturing process of a semiconductor device such as a flash memory, is performed by the substrate processing apparatus 100 described above. In the following description, the operations of the components constituting the substrate processing apparatus 100 are controlled by the controller 221.

For example, although not shown, a trench is formed in advance on the surface of the wafer 200 to be processed by the substrate processing according to the present embodiments. In addition, the trench includes a concave-convex portion of a high aspect ratio. According to the present embodiments, for example, the oxidation process serving as a process using the plasma (that is, the substrate processing) is performed to a silicon layer exposed on an inner wall of the trench.

<Substrate Loading Step S110>

First, the wafer 200 is transferred (loaded) into the process chamber 201. Specifically, the susceptor 217 is lowered to a position for transferring the wafer 200 (also referred to as a "transfer position") by the susceptor elevator 268 such that the wafer lift pins 266 pass through the through-holes 217A of the susceptor 217. As a result, the wafer lift pins 266 protrude from a surface of the susceptor 217 by a predetermined height.

Subsequently, the gate valve 244 is opened, and the wafer 200 is transferred (loaded) into the process chamber 201 using a wafer transfer device (not shown) from a vacuum transfer chamber (not shown) provided adjacent to the process chamber 201. The wafer 200 loaded into the process chamber 201 is placed on and supported in a horizontal orientation by the wafer lift pins 266 protruding from the surface of the susceptor 217. After the wafer 200 is loaded into the process chamber 201 and supported by the wafer lift pins 266, the wafer transfer device is retracted to an outside of the process chamber 201. Then, the gate valve 244 is closed to seal (close) an inside of the process chamber 201 hermetically. Thereafter, by elevating the susceptor 217 using the susceptor elevator 268, the wafer 200 is placed on and supported by an upper surface of the susceptor 217.

<Temperature Elevation and Vacuum Exhaust Step S120>

Subsequently, a temperature of the wafer 200 loaded into the process chamber 201 is elevated. The heater 217B is heated in advance, and the wafer 200 is held by the susceptor 217 in which the heater 217B is embedded. Thereby, for example, the wafer 200 is heated to a predetermined temperature within a range from 150° C. to 750° C. Further, while the wafer 200 is being heated, the vacuum pump 246 vacuum-exhausts the inner atmosphere of the process chamber 201 through the gas exhaust pipe 231 such that an inner pressure of the process chamber 201 reaches and is maintained at a predetermined pressure. The vacuum pump 246 continuously vacuum-exhausts the inner atmosphere of the process chamber 201 at least until a substrate unloading step S160 described later is completed.

<Reactive Gas Supply Step S130>

Subsequently, the oxygen-containing gas and the hydrogen-containing gas are supplied into the process chamber 201 as the reactive gas. Specifically, the valves 253A and 253B are opened to start a supply of the oxygen-containing gas and a supply of the hydrogen-containing gas, respectively, into the process chamber 201 while flow rates of the oxygen-containing gas and the hydrogen-containing gas are adjusted by the MFCs 252A and 252B, respectively. In the reactive gas supply step S130, for example, the flow rate of the oxygen-containing gas is set to a predetermined flow rate within a range from 20 sccm to 2,000 sccm. In addition, for example, the flow rate of the hydrogen-containing gas is set to a predetermined flow rate within a range from 20 sccm to 1,000 sccm.

In the reactive gas supply step S130, the inner atmosphere of the process chamber 201 is exhausted by adjusting the opening degree of the APC valve 242 such that, for example, the inner pressure of the process chamber 201 is at a predetermined pressure within a range from 1 Pa to 250 Pa. The oxygen-containing gas and the hydrogen-containing gas are continuously supplied into the process chamber 201 while appropriately exhausting the inner atmosphere of the process chamber 201 until a plasma processing step S140 described later is completed.

For example, as the oxygen-containing gas, a gas such as oxygen ($O_2$) gas, nitrogen peroxide ($N_2O$) gas, nitrogen monoxide (NO) gas, nitrogen dioxide ($NO_2$) gas, ozone ($O_3$) gas, water vapor ($H_2O$ gas), carbon monoxide (CO)

gas and carbon dioxide (CO2) gas may be used. In addition, one or more of the gases described above may be used as the oxygen-containing gas.

Further, for example, as the hydrogen-containing gas, a gas such as hydrogen (H2) gas, deuterium (D2) gas, the H2O gas and ammonia (NH3) gas may be used. In addition, one or more of the gases described above may be used as the hydrogen-containing gas. When the H2O gas is used as the oxygen-containing gas, it is preferable that a gas other than the H2O gas is used as the hydrogen-containing gas. In addition, when the H2O gas is used as the hydrogen-containing gas, it is preferable that a gas other than the H2O gas is used as the oxygen-containing gas.

For example, as the inert gas, nitrogen (N2) gas may be used. In addition, a rare gas such as argon (Ar) gas, helium (He) gas, neon (Ne) gas and xenon (Xe) gas may be used as the inert gas. For example, one or more of the gases described above may be used as the inert gas.

<Plasma Processing Step S140>

In the plasma processing step S140, first, while supplying the process gas through the gas supplier, the RF power is supplied from the RF power supplier 271 to the first resonance coil 212 without supplying the RF power from the RF power supplier 281 to the second resonance coil 214. Specifically, when the inner pressure of the process chamber 201 is stabilized, a supply of the RF power is started for the first resonance coil 212 from the RF power supply 273 via the RF sensor 272.

Thereby, a high frequency electromagnetic field is formed in the plasma generation space 201A to which the oxygen-containing gas and the hydrogen-containing gas are supplied. As a result, the donut-shaped ICP 310 whose plasma density is the highest at a height corresponding to the electrical midpoint of the first resonance coil 212 in the plasma generation space 201A is excited by the high frequency electromagnetic field. The oxygen-containing gas and the hydrogen-containing gas are excited into a plasma state and dissociate. As a result, reactive species such as oxygen radicals containing oxygen (oxygen active species), oxygen ions, hydrogen radicals containing hydrogen (hydrogen active species) and hydrogen ions can be generated.

The radicals generated by the induction plasma and non-accelerated ions are uniformly supplied into the trench of the wafer 200 placed on the susceptor 217 in the substrate processing space 201B. Then, the radicals and the ions uniformly supplied into the trench of the wafer 200 uniformly react with a layer (for example, the silicon layer) formed on a surface of the inner wall of the trench. Thereby, the layer formed on the surface of the inner wall of the trench is modified into an oxide layer (for example, a silicon oxide layer) whose step coverage is good.

After a predetermined process time (for example, 10 seconds to 300 seconds) has elapsed, the supply of the RF power from the RF power supply 273 is stopped.

Subsequently, while supplying the process gas through the gas supplier, the RF power is supplied from the RF power supplier 281 to the second resonance coil 214 without supplying the RF power from the RF power supplier 271 to the first resonance coil 212. Specifically, when the inner pressure of the process chamber 201 is stabilized, a supply of the RF power is started for the second resonance coil 214 from the RF power supply 283 via the RF sensor 282.

Thereby, a high frequency electromagnetic field is formed in the plasma generation space 201A to which the oxygen-containing gas and the hydrogen-containing gas are supplied. As a result, the donut-shaped ICP 312 whose plasma density is the highest at a height corresponding to the electrical midpoint of the second resonance coil 214 in the plasma generation space 201A is excited by the high frequency electromagnetic field. The oxygen-containing gas and the hydrogen-containing gas are excited into the plasma state and dissociate. As a result, the reactive species such as the oxygen radicals containing oxygen (the oxygen active species), the oxygen ions, the hydrogen radicals containing hydrogen (hydrogen active species) and the hydrogen ions can be generated.

The radicals generated by the induction plasma (that is, the donut-shaped ICP 312), the radicals generated by the induction plasma (that is, the donut-shaped ICP 310) generated by the first resonance coil 212 and whose lifetime is extended in the present step and non-accelerated ions are uniformly supplied into the trench of the wafer 200 placed on the susceptor 217 in the substrate processing space 201B. Then, the radicals and the ions uniformly supplied into the trench of the wafer 200 uniformly react with the layer (for example, the silicon layer) formed on the surface of the inner wall of the trench. Thereby, the layer formed on the surface of the inner wall of the trench is modified into the oxide layer (for example, the silicon oxide layer) whose step coverage is good.

After a predetermined process time (for example, 10 seconds to 300 seconds) has elapsed, the supply of the RF power from the RF power supply 283 is stopped. Thereby, the plasma discharge in the process chamber 201 is stopped.

In addition, the valves 253A and 253B are closed to stop the supply of the oxygen-containing gas and the supply of the hydrogen-containing gas into the process chamber 201. Thereby, the plasma processing step S140 is completed.

<Vacuum Exhaust Step S150>

After the supply of the oxygen-containing gas and the supply of the hydrogen-containing gas are stopped, the inner atmosphere of the process chamber 201 is vacuum-exhausted through the gas exhaust pipe 231. Thereby, the gas such as the oxygen-containing gas, the hydrogen-containing gas and an exhaust gas generated from the reaction therebetween in the process chamber 201 is exhausted to the outside of the process chamber 201. Thereafter, the opening degree of the APC valve 242 is adjusted such that the inner pressure of the process chamber 201 is adjusted to the same pressure as that of the vacuum transfer chamber (not shown) provided adjacent to the process chamber 201. The vacuum transfer chamber serves as an unloading destination of the wafer 200.

<Substrate Unloading Step S160>

After the inner pressure of the process chamber 201 is adjusted to a predetermined pressure, the susceptor 217 is lowered to the transfer position of the wafer 200 until the wafer 200 is supported by the wafer lift pins 266. Then, the gate valve 244 is opened, and the wafer 200 is transferred (unloaded) out of the process chamber 201 by using the wafer transfer device (not shown).

Thereby, the substrate processing according to the present embodiments is completed.

Other Embodiments

While the technique of the present disclosure is described in detail by way of the embodiments described above, the technique of the present disclosure is not limited thereto. For example, the embodiments described above may be appropriately combined.

For example, the above-described embodiments are described by way of an example in which the second arrangement region SA is provided closer to the susceptor 217 than the first arrangement region FA in the up-and-down direction of the substrate processing apparatus 100 (that is, the vertical direction). However, the technique of the present disclosure is not limited thereto. For example, the second arrangement region SA may be provided farther from the susceptor 217 than the first arrangement region FA in the up-and-down direction of the substrate processing apparatus 100 (that is, the vertical direction).

Figure 12:
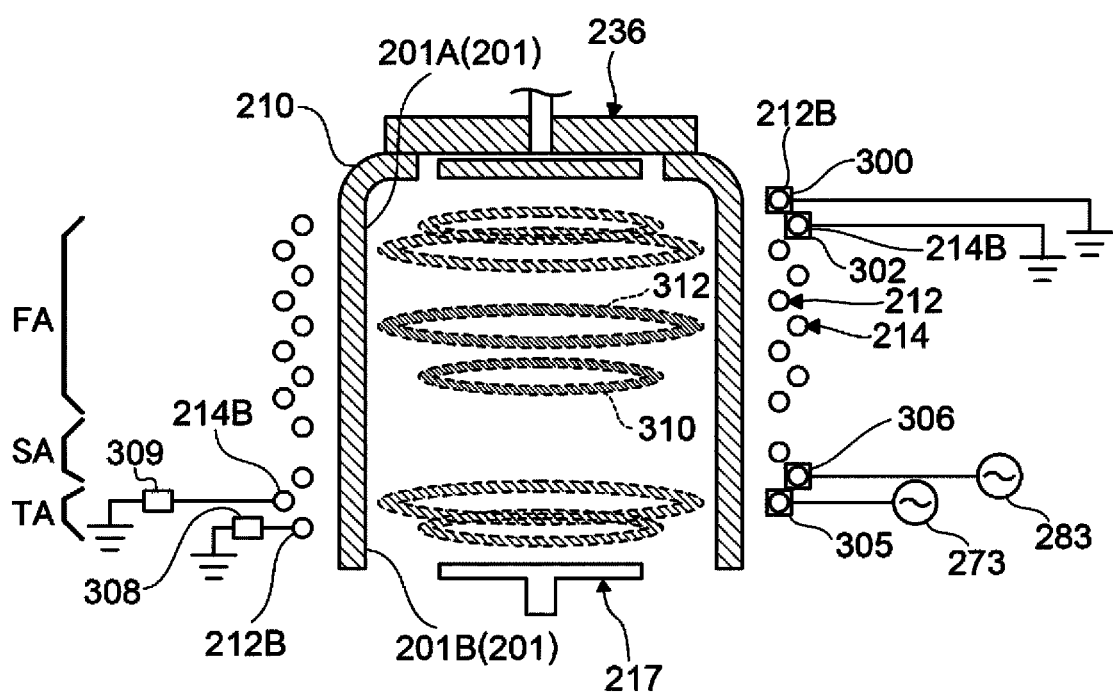
FIG. 12 is a diagram schematically illustrating an internal state of the process furnace when the process gas is excited into the plasma state using a modified example of a resonance coil preferably used in the embodiments of the present disclosure.

For example, the above-described embodiments are described by way of an example in which the first arrangement region FA and the second arrangement region SA are provided on the outer periphery of the process vessel 203 as shown in FIG. 8. However, the technique of the present disclosure is not limited thereto. For example, as shown in FIG. 12, a third arrangement region TA may be provided opposite to the first arrangement region FA with the second arrangement region SA provided therebetween. In the third arrangement region TA, the conductor 212A of the first resonance coil 212 and the conductor 214A of the second resonance coil 214 are alternately arranged in the vertical direction (that is, the axial direction of each resonance coil). In such a case, by grounding the both ends of the first resonance coil 212, it is possible to provide the multiple of the wavelength of the RF power supplied to the first resonance coil 212. Thereby, it is possible to provide the sine curve of the voltage. As a result, it is possible to easily control the peak of the voltage distribution of the first resonance coil 212.

For example, the above-described embodiments are described by way of an example in which the axial length of the coil portion of the first resonance coil 212 is set to be different from the axial length of the coil portion of the second resonance coil 214. However, the technique of the present disclosure is not limited thereto. For example, the axial length of the coil portion of the first resonance coil 212 may be the same as the axial length of the coil portion of the second resonance coil 214. In such a case, for example, the first resonance coil 212 and the second resonance coil 214 may be arranged such that the first resonance coil 212 entirely overlaps with the second resonance coil 214, or such that a lower portion of the first resonance coil 212 overlaps with an upper portion of the second resonance coil 214. Further, even when the axial length of the coil portion of the first resonance coil 212 is set to be different from the axial length of the coil portion of the second resonance coil 214, the first resonance coil 212 and the second resonance coil 214 may be arranged such that a part of the coil portion of the first resonance coil 212 in the axial direction overlaps with a part of the coil portion of the second resonance coil 214 in the axial direction.

For example, the above-described embodiments are described by way of an example in which the process chamber 201 defined by the process vessel 203 includes the plasma generation room and the substrate processing room (That is, the plasma generation room and the substrate processing room are configured by the same process vessel 203). However, the technique of the present disclosure is not limited thereto. For example, the plasma generation room and the substrate processing room may be configured as separate vessels.

For example, the above-described embodiments are described by way of an example in which the oxidation process using the plasma is performed onto the surface of the substrate. However, the technique of the present disclosure is not limited thereto. For example, a nitridation process using a nitrogen-containing gas as the process gas may be performed. Further, the technique of the present disclosure is not limited to the nitridation process and the oxidation process, and may be applied to other processing techniques of processing the substrate using the plasma. For example, the technique of the present disclosure may be applied to a process such as a modification process onto a film formed on the surface of the substrate, a doping process, a reduction process of an oxide film, an etching process with respect to the film and a photoresist ashing process, which are performed by using the plasma.

For example, the above-described embodiments are described by way of an example in which the two resonance coils are used. However, the technique of the present disclosure is not limited thereto. For example, three or more resonance coils may be used.

For example, the above-described embodiments are described by way of the embodiments and modified examples described above. However, the technique of the present disclosure is not limited thereto. It is apparent to the person skilled in the art that the technique of the present disclosure may be modified in various ways without departing from the scope thereof.

According to some embodiments of the present disclosure, it is possible to improve the uniformity of the substrate processing on the surface of the substrate.

What is claimed is:

1. A substrate processing apparatus comprising:
   a plasma generation space capable of generating a plasma;
   a substrate processing space capable of processing a substrate;
   a gas supplier capable of supplying a gas into the plasma generation space;
   a first coil provided to surround the plasma generation space and configured to generate a first voltage distribution; and
   a second coil provided to surround the plasma generation space and configured to generate a second voltage distribution such that a peak of the second voltage distribution does not overlap with a peak of the first voltage distribution,
   wherein the first coil partially overlaps with the second coil when viewed along a vertical direction.

2. The substrate processing apparatus of claim 1, wherein the second coil is further configured such that, in a direction perpendicular to an axial direction, the peak of the second voltage distribution does not overlap with the peak of the first voltage distribution.

3. The substrate processing apparatus of claim 1, wherein the second coil is further configured such that, in an axial direction, the peak of the second voltage distribution does not overlap with the peak of the first voltage distribution.

4. The substrate processing apparatus of claim 1, wherein a first arrangement region in which a conductor constituting the first coil and a conductor constituting the second coil are alternately arranged in an axial direction, and a second arrangement region in which the conductor constituting the first coil is arranged and wounded a plurality of times with a gap without arranging the conductor constituting the second coil in the axial direction are provided at an outer side of the plasma generation space.

5. The substrate processing apparatus of claim 4, wherein the second arrangement region is provided closer to a substrate support on which the substrate is placed than the first arrangement region in the axial direction.

6. The substrate processing apparatus of claim 5, further comprising an exhauster capable of exhausting the gas from an outer periphery of the substrate support.

7. The substrate processing apparatus of claim 4, wherein, in the first arrangement region, the conductor of the first coil and the conductor of the second coil are separated from each other at a distance such that no arc discharge is generated therebetween, and, in the second arrangement region, the conductor of the first coil is provided such that no arc discharge is generated between wounded portions of the conductor of the first coil.

8. The substrate processing apparatus of claim 4, wherein the second arrangement region is provided farther from a substrate support on which the substrate is placed than the first arrangement region in the axial direction.

9. The substrate processing apparatus of claim 4, wherein a third arrangement region in which the conductor of the first coil and the conductor of the second coil are alternately arranged in the axial direction is provided on an outer periphery of the plasma generation space opposite to the first arrangement region with the second arrangement region provided therebetween.

10. The substrate processing apparatus of claim 1, wherein a winding diameter of the first coil is set to be different from a winding diameter of the second coil.

11. The substrate processing apparatus of claim 1, wherein a winding diameter of the first coil is set to be less than a winding diameter of the second coil.

12. The substrate processing apparatus of claim 1, wherein the first coil comprises a pair of ground connection portions capable of being connected to a ground, and an electrical length between the pair of ground connection portions of the first coil is set to be a multiple of a wavelength of an electric power supplied to the first coil.

13. The substrate processing apparatus of claim 12, wherein the second coil comprises a pair of ground connection portions capable of being connected to the ground, and an electrical length between the pair of ground connection portions of the second coil is set to be a multiple of a wavelength of an electric power supplied to the second coil.

14. The substrate processing apparatus of claim 13, wherein a position of a ground connection portion among the pair of ground connection portions of the first coil located adjacent to a first end of the first coil in an axial direction is set to be different from a position of a ground connection portion among the pair of ground connection portions of the second coil located adjacent to a first end of the second coil in the axial direction.

15. The substrate processing apparatus of claim 13, wherein a position of a ground connection portion among the pair of ground connection portions of the first coil located adjacent to a second end of the first coil in an axial direction is set to be different from a position of a ground connection portion among the pair of ground connection portions of the second coil located adjacent to a second end of the second coil in the axial direction.

16. The substrate processing apparatus of claim 1, wherein a waveform adjustment circuit configured to correct an electrical length is provided at at least one of the first coil or the second coil such that the electrical length of the first coil and the electrical length of the second coil are equal to each other.

17. The substrate processing apparatus of claim 1, wherein an axial direction of the first coil is equal to that of the second coil.

18. A substrate processing method, comprising:
 (a) generating a first voltage distribution by a first coil provided to surround a plasma generation space and generating a second voltage distribution by a second coil provided to surround the plasma generation space, wherein a peak of the second voltage distribution does not overlap with a peak of the first voltage distribution, and the first coil partially overlaps with the second coil when viewed along a vertical direction; and
 (b) generating a plasma by supplying a gas into the plasma generation space, and processing a substrate accommodated in a substrate processing space.

19. A method of manufacturing a semiconductor device, comprising the substrate processing method of claim 18.

20. A non-transitory computer-readable recording medium storing a program that causes, by a computer, a substrate processing apparatus to perform:
 (a) generating a first voltage distribution by a first coil provided to surround a plasma generation space and generating a second voltage distribution by a second coil provided to surround the plasma generation space, wherein a peak of the second voltage distribution does not overlap with a peak of the first voltage distribution, and the first coil partially overlaps with the second coil when viewed along a vertical direction; and
 (b) generating a plasma by supplying a gas into the plasma generation space, and processing a substrate accommodated in a substrate processing space.

* * * * *